(12) United States Patent
Wang et al.

(10) Patent No.: US 9,608,161 B2
(45) Date of Patent: Mar. 28, 2017

(54) SEMICONDUCTOR LIGHT-EMITTING DEVICE

(71) Applicant: PlayNitride Inc., Tainan (TW)

(72) Inventors: Shen-Jie Wang, Tainan (TW); Yu-Chu Li, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/941,683

(22) Filed: Nov. 16, 2015

(65) Prior Publication Data

US 2016/0181472 A1 Jun. 23, 2016

(30) Foreign Application Priority Data

Dec. 23, 2014 (TW) .............................. 103144979 A

(51) Int. Cl.
*H01L 33/32* (2010.01)
*H01L 33/14* (2010.01)
*H01L 33/02* (2010.01)
*H01L 33/04* (2010.01)

(52) U.S. Cl.
CPC .............. *H01L 33/14* (2013.01); *H01L 33/02* (2013.01); *H01L 33/04* (2013.01); *H01L 33/32* (2013.01)

(58) Field of Classification Search
CPC ......... H01L 33/14; H01L 33/32; H01L 33/42; H01L 33/06; H01L 33/325; H01L 33/38; H01L 33/0025; H01L 33/0075; H01L 33/12; H01L 33/20; H01L 33/02; H01L 33/04
See application file for complete search history.

(56) References Cited

U.S. PATENT DOCUMENTS

| | | | | |
|---|---|---|---|---|
| 5,724,376 A | * | 3/1998 | Kish, Jr. ............... | H01S 5/0217 372/36 |
| 6,495,862 B1 | * | 12/2002 | Okazaki ................ | H01L 33/20 257/103 |
| 7,193,246 B1 | * | 3/2007 | Tanizawa .............. | B82Y 20/00 257/101 |
| 7,244,957 B2 | * | 7/2007 | Nakajo .................. | H01L 33/20 257/12 |
| 7,700,940 B2 | * | 4/2010 | Sakai .................... | B82Y 20/00 257/14 |
| 8,088,637 B1 | * | 1/2012 | Wong .................... | B82Y 20/00 257/E33.008 |
| 8,124,993 B2 | * | 2/2012 | Bour ..................... | H01L 21/268 257/94 |
| 8,129,711 B2 | * | 3/2012 | Kang .................... | H01L 33/24 257/17 |
| 8,154,009 B1 | * | 4/2012 | Wong .................... | B82Y 20/00 257/13 |
| 9,112,105 B1 | * | 8/2015 | Yang ..................... | H01L 33/24 |
| 9,166,102 B2 | * | 10/2015 | Okuno ................... | H01L 33/04 |

(Continued)

*Primary Examiner* — Bac Au
*Assistant Examiner* — Sophia Nguyen
(74) *Attorney, Agent, or Firm* — Jianq Chyun IP Office

(57) ABSTRACT

A semiconductor light-emitting device including an N-type semiconductor layer, a plurality of P-type semiconductor layers, a light-emitting layer, and a contact layer is provided. The light-emitting layer is disposed between the N-type semiconductor layer and the whole of the P-type semiconductor layers. The P-type semiconductor layers are disposed between the contact layer and the light-emitting layer. All the P-type semiconductor layers between the light-emitting layer and the contact layer include aluminum.

6 Claims, 2 Drawing Sheets

(56) References Cited

U.S. PATENT DOCUMENTS

| | | | |
|---|---|---|---|
| 9,233,844 B2* | 1/2016 | Chen | B82Y 10/00 |
| 9,312,447 B2* | 4/2016 | Han | H01L 33/32 |
| 2002/0081763 A1* | 6/2002 | Ishibashi | B82Y 20/00 438/32 |
| 2003/0047744 A1* | 3/2003 | Yanamoto | B82Y 20/00 257/98 |
| 2006/0054907 A1* | 3/2006 | Lai | H01L 33/22 257/96 |
| 2006/0118820 A1* | 6/2006 | Gaska | B82Y 20/00 257/189 |
| 2006/0131558 A1* | 6/2006 | Sato | B82Y 20/00 257/17 |
| 2006/0175600 A1* | 8/2006 | Sato | B82Y 20/00 257/14 |
| 2006/0273300 A1* | 12/2006 | Son | B82Y 20/00 257/15 |
| 2006/0273333 A1* | 12/2006 | Wu | H01L 33/20 257/94 |
| 2007/0040162 A1* | 2/2007 | Song | H01L 33/42 257/13 |
| 2007/0108456 A1* | 5/2007 | Wong | B82Y 20/00 257/94 |
| 2007/0145406 A1* | 6/2007 | Han | H01L 33/04 257/103 |
| 2007/0268948 A1* | 11/2007 | Freund | B82Y 20/00 372/46.01 |
| 2008/0137701 A1* | 6/2008 | Freund | H01S 5/32341 372/45.011 |
| 2008/0315233 A1* | 12/2008 | Kim | H01L 33/32 257/98 |
| 2009/0014713 A1* | 1/2009 | Kang | H01L 33/0075 257/13 |
| 2009/0050874 A1* | 2/2009 | Kim | H01L 33/02 257/13 |
| 2009/0065763 A1* | 3/2009 | Kamiyama | H01L 33/04 257/13 |
| 2009/0242924 A1* | 10/2009 | Lin | H01L 33/22 257/99 |
| 2009/0315050 A1* | 12/2009 | Lee | H01L 33/08 257/98 |
| 2010/0044674 A1* | 2/2010 | Kim | H01L 33/04 257/13 |
| 2010/0148150 A1* | 6/2010 | Miki | H01L 33/06 257/13 |
| 2010/0219445 A1* | 9/2010 | Yokoyama | H01L 33/025 257/101 |
| 2011/0101391 A1* | 5/2011 | Miki | C23C 16/0272 257/94 |
| 2012/0037881 A1* | 2/2012 | Kim | H01L 33/007 257/13 |
| 2012/0175589 A1* | 7/2012 | Ooshika | H01L 33/32 257/13 |
| 2012/0273814 A1* | 11/2012 | Pan | H01L 33/145 257/88 |
| 2012/0313077 A1* | 12/2012 | Nakamura | H01L 21/02389 257/13 |
| 2012/0319080 A1* | 12/2012 | Fudeta | H01L 33/12 257/13 |
| 2013/0001509 A1* | 1/2013 | Fudeta | H01L 33/04 257/13 |
| 2013/0015465 A1* | 1/2013 | Lee | H01L 33/40 257/76 |
| 2013/0087761 A1* | 4/2013 | Kimura | H01L 33/12 257/13 |
| 2013/0134475 A1* | 5/2013 | Han | H01L 33/04 257/101 |
| 2013/0146842 A1* | 6/2013 | Kim | H01L 33/06 257/13 |
| 2013/0168691 A1* | 7/2013 | Sakai | H01L 21/0243 257/76 |
| 2013/0192656 A1* | 8/2013 | Hardin | H01L 31/078 136/244 |
| 2013/0234107 A1* | 9/2013 | Cheon | H01L 33/04 257/13 |
| 2013/0292687 A1* | 11/2013 | Jiang | H01L 31/03048 257/76 |
| 2013/0320355 A1* | 12/2013 | Xie | C30B 25/186 257/76 |
| 2014/0014897 A1* | 1/2014 | Kim | H01L 33/06 257/13 |
| 2014/0054542 A1* | 2/2014 | Han | H01L 33/12 257/13 |
| 2014/0299968 A1* | 10/2014 | Wang | H01L 21/0237 257/618 |
| 2014/0346438 A1* | 11/2014 | Kim | H01L 33/04 257/13 |
| 2015/0083994 A1* | 3/2015 | Jain | H01L 33/0025 257/13 |
| 2015/0125980 A1* | 5/2015 | Kurihara | H01L 33/0075 438/45 |
| 2015/0137150 A1* | 5/2015 | Li | H01L 33/08 257/88 |
| 2015/0162212 A1* | 6/2015 | Cavaco | H01L 21/32051 438/605 |
| 2015/0171263 A1* | 6/2015 | Nakatsu | H01L 33/007 257/13 |
| 2015/0179874 A1* | 6/2015 | Li | H01L 33/32 257/94 |
| 2015/0236212 A1* | 8/2015 | Lee | H01L 33/405 257/98 |
| 2015/0333218 A1* | 11/2015 | Han | H01L 33/06 257/13 |
| 2015/0349202 A1* | 12/2015 | Yamamoto | H01L 33/02 257/98 |
| 2016/0043279 A1* | 2/2016 | Jean | H01L 33/325 257/13 |
| 2016/0064598 A1* | 3/2016 | Choi | H01L 33/06 257/13 |
| 2016/0118531 A1* | 4/2016 | Jain | H01L 33/04 257/94 |
| 2016/0149075 A1* | 5/2016 | Atanackovic | H01L 33/06 257/13 |

* cited by examiner

SEMICONDUCTOR LIGHT-EMITTING DEVICE

CROSS-REFERENCE TO RELATED APPLICATION

This application claims the priority benefit of Taiwan application serial no. 103144979, filed on Dec. 23, 2014. The entirety of the above-mentioned patent application is hereby incorporated by reference herein and made a part of this specification.

BACKGROUND

Field of the Invention

The invention is directed to a light-emitting device and more particularly, to a semiconductor light-emitting device.

Description of Related Art

With the evolution of photoelectrical technology, traditional incandescent bulbs and fluorescent lamps have been gradually replaced by solid-state light sources of the new generation, such as light-emitting diodes (LEDs). The LEDs have advantages, such as long lifespans, small sizes, high shock resistance, high light efficiency and low power consumption and thus, have been widely adopted as light sources in applications including household lighting appliances as well as various types of equipment. Besides being widely adopted in light sources of backlight modules of liquid crystal displays (LCDs) and household lighting appliances, the application of the LEDs have been expanded to street lighting, large outdoor billboards, traffic lights and the related fields in recent years. As a result, the LEDs have been developed as the light sources featuring economic power consumption and environmental protection.

Recently, most developers of solid-state light sources make effort to pursue good luminance efficiency. Subjects with respect to improving the luminance efficiency of the LEDs are generally divided into how to improve internal quantum efficiency (i.e., luminance efficiency of a light-emitting layer) and how to improve external quantum efficiency (which is further affected by light extraction efficiency). However, in a conventional gallium nitride (GaN) LED, a band gap between a P-type GaN semiconductor layer and an N-type GaN semiconductor layer is approximate to a band gap of the light-emitting layer, such that blue light or ultraviolet (UV) light emitted from the light-emitting layer is easily absorbed, which leads to reduced luminance efficiency of the LED.

SUMMARY

The invention provides a semiconductor light-emitting device with better luminescence efficiency.

According to an embodiment of the invention, a semiconductor light-emitting device including an N-type semiconductor layer, a plurality of P-type semiconductor layers, a light-emitting layer and a contact layer. The light-emitting layer is between the N-type semiconductor layer and the whole of the P-type semiconductor layers. The P-type semiconductor layers are disposed between the contact layer and the light-emitting layer. All the P-type semiconductor layers between the light-emitting layer and the contact layer include aluminum.

In an embodiment of the invention, the P-type dopant of the P-type semiconductor layers is a group IIA element dopant.

In an embodiment of the invention, the group IIA element dopant is a magnesium (Mg) dopant.

In an embodiment of the invention, the P-type semiconductor layers include a first P-type super lattice layer and a P-type indium aluminum gallium nitride (InAlGaN) layer. The P-type InAlGaN layer is disposed between the light-emitting layer and the first P-type super lattice layer, and the first P-type super lattice layer is disposed between the P-type InAlGaN layer and the contact layer.

In an embodiment of the invention, the first P-type super lattice layer includes a plurality of first P-type aluminum gallium nitride (AlGaN) layers and a plurality of second P-type AlGaN layers which are alternately stacked, and the concentration of the P-type dopant in each of the first P-type AlGaN layers is different from the concentration of the P-type dopant in each of the second P-type AlGaN layers.

In an embodiment of the invention, the P-type semiconductor layers further include a second P-type super lattice layer disposed between the first P-type super lattice layer and the contact layer, and the concentration of aluminum in the second P-type super lattice layer is lower than the concentration of aluminum in the first P-type super lattice layer.

In an embodiment of the invention, the second P-type super lattice layer includes a plurality of third P-type AlGaN layers and a plurality of fourth P-type AlGaN layers which are alternately stacked, and the concentration of the P-type dopant in each of the third P-type AlGaN layers is different from the concentration of the P-type dopant in each of the fourth P-type AlGaN layers.

In an embodiment of the invention, the contact layer is an ohmic contact layer.

In an embodiment of the invention, the semiconductor light-emitting device further includes a first electrode and a second electrode. The first electrode is electrically connected to the N-type semiconductor layer, and the second electrode is disposed on the contact layer.

In an embodiment of the invention, light emitted from the light-emitting layer comprises blue light, ultraviolet (UV) light or a combination thereof.

In the semiconductor light-emitting device provided by the embodiments of the invention, since all the P-type semiconductor layers between the light-emitting layer and the contact layer contain aluminum, a band gap of each of the P-type semiconductor layers can be increased. In this way, the light emitted from the light-emitting layer can be less absorbed by the P-type semiconductor layers, such that the luminance efficiency of the semiconductor light-emitting device can be enhanced.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
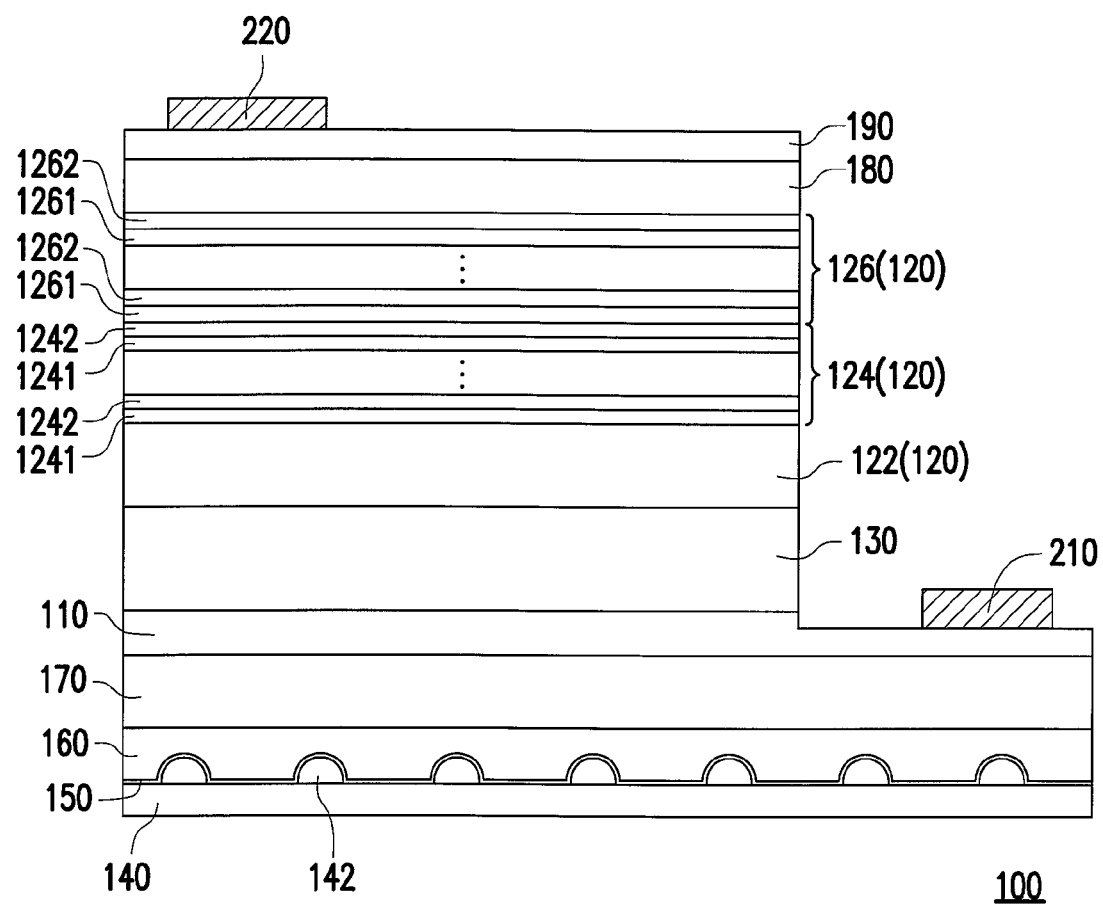
FIG. 1 is a cross-sectional diagram illustrating a semiconductor light-emitting device according to an embodiment of the invention.

FIG. 1 is a cross-sectional diagram illustrating a semiconductor light-emitting device according to an embodiment of the invention. With reference to FIG. 1, a semiconductor light-emitting device 100 of the present embodiment includes an N-type semiconductor layer 110, a plurality of P-type semiconductor layers 120, a light-emitting layer 130 and a contact layer 180. The light-emitting layer 130 is disposed between the N-type semiconductor layer 110 and the whole of the P-type semiconductor layers 120. The P-type semiconductor layers 120 are disposed between the contact layer 180 and the light-emitting layer 130. Light emitted from the light-emitting layer 130 may include blue light, ultraviolet (UV) light or a combination thereof. In the present embodiment, the light-emitting layer 130 may be, for example, a multiple quantum well (MQW) layer formed by alternately stacking a plurality of N-type indium gallium nitride (InGaN) layers and a plurality of N-type gallium nitride (GaN) layers, which is capable of emitting the blue light. Additionally, in the present embodiment, all the P-type semiconductor layers 120 between the light-emitting layer 130 and the contact layer 180 contain aluminum.

In the semiconductor light-emitting device 100 of the present embodiment, since all the P-type semiconductor layers 120 between the light-emitting layer 130 and the contact layer 180 contain aluminum, the band gap of each P-type semiconductor layer 120 can be enhanced. In this way, the light (e.g. the blue light, the UV light or the combination thereof) emitted from the light-emitting layer 130 may be less absorbed by the P-type semiconductor layers 120, such that luminance efficiency of the semiconductor light-emitting device 100 can be improved.

In the present embodiment, the P-type dopant of the P-type semiconductor layers 120 is a group IIA element dopant, such as an Mg dopant. Additionally, in the present embodiment, the P-type semiconductor layers 120 includes a first P-type super lattice layer 124 and a P-type indium aluminum gallium nitride (InAlGaN) layer 122. The P-type InAlGaN layer 122 is disposed between the light-emitting layer 130 and the first P-type super lattice layer 124, and the first P-type super lattice layer 124 is disposed between the P-type InAlGaN layer 122 and the contact layer 180.

In the present embodiment, the first P-type super lattice layer 124 includes a plurality of first P-type aluminum gallium nitride (AlGaN) layers 1241 and a plurality of second P-type AlGaN layers 1242 which are alternately stacked, where the concentration of the P-type dopant (e.g., the doping concentration of Mg) in each first P-type AlGaN layer 1241 is different from the concentration of the P-type dopant (e.g., the doping concentration of Mg) in each second P-type AlGaN layer 1242.

In the present embodiment, the P-type semiconductor layers 120 further include a second P-type super lattice layer 126 disposed between the first P-type super lattice layer 124 and the contact layer 180, in which the concentration of aluminum in the second P-type super lattice layer 126 is lower than the concentration of aluminum in the first P-type super lattice layer 124. In the present embodiment, the second P-type super lattice layer 126 includes a plurality of third P-type AlGaN layers 1261 and a plurality of fourth P-type AlGaN layers 1262 which are alternately stacked, in which the concentration of the P-type dopant (e.g., the doping concentration of Mg) in each third P-type AlGaN layer 1261 is different from the concentration of the P-type dopant (e.g., the doping concentration of Mg) in each fourth P-type AlGaN layer 1262.

In an embodiment, the doping concentration of Mg in each first P-type AlGaN layer 1241 may fall within a range from $10^{19}$ atoms/cm$^3$ to $10^{20}$ atoms/cm$^3$, and a mole ratio of aluminum therein may fall within a range of 10~15%. The doping concentration of Mg of in each second P-type AlGaN layer 1242 may fall within a range from $5\times10^{18}$ atoms/cm$^3$ to $5\times10^{19}$ atoms/cm$^3$, and a mole ratio of aluminum therein may fall within a range of 1~5%. The doping concentration of Mg in each third P-type AlGaN layer 1261 may fall within a range from $10^{19}$ atoms/cm$^3$ to $5\times10^{19}$ atoms/cm$^3$, and a mole ratio of aluminum therein may fall within a range of 3~8%. The doping concentration of Mg of in each fourth P-type AlGaN layer 1262 may fall within a range from $5\times10^{18}$ atoms/cm$^3$ to $10^{19}$ atoms/cm$^3$, and a mole ratio of aluminum therein may fall within a range of 1~3%.

In other embodiments, the semiconductor light-emitting device 100 may include the first P-type super lattice layer 124, but no second P-type super lattice layer 126.

In the present embodiment, the N-type semiconductor layer 110 is, for example, an N-type gallium nitride (GaN) layer. Additionally, in the present embodiment, the semiconductor light-emitting device 100 further includes a first electrode 210 and a second electrode 220. The first electrode 210 is electrically connected to the N-type semiconductor layer 110, e.g., disposed on the N-type semiconductor layer 110, and the second electrode 220 is disposed on the contact layer 180. In the present embodiment, the semiconductor light-emitting device 100 further includes a transparent conductive layer 190 (e.g., an indium tin oxide (ITO) layer) disposed on the contact layer 180, and the second electrode 220 is disposed on the transparent conductive layer 190. The contact layer 180 serves to reduce contact resistance between the transparent conductive layer 190 and the P-type semiconductor layers 120. In the present embodiment, the contact layer 180 is an ohmic contact layer, which is a conductor, i.e., a P-type doped layer with a high concentration P-type dopant or an N-type doped layer with a high concentration N-type dopant. In an embodiment, the concentration of an electron donor or an electron acceptor in the contact layer 180 is greater than or equal to $10^{20}$ atoms/cm$^3$, and thus, the conductivity of the contact layer 180 is similar to the conductivity of a conductor. For example, the contact layer 180 may be a P-type InGaN layer, e.g., an Mg-doped InGaN layer.

In the present embodiment, the semiconductor light-emitting device 100 may further include a substrate 140, a nucleation layer 150, a buffer layer 160 and an unintentionally doped semiconductor layer 170. In the present embodiment, the substrate 140 is a patterned sapphire substrate having surface patterns 142 (e.g., protruding patterns) to provide a light-scattering effect, so as to improve light extraction efficiency. The nucleation layer 150, buffer layer 160, the unintentionally doped semiconductor layer 170, the N-type semiconductor layer 110, the light-emitting layer 130, the P-type semiconductor layers 120, contact layer 180, the transparent conductive layer 190 and the second electrode 220 are stacked in sequence on the substrate 140. In the present embodiment, the nucleation layer 150, the buffer layer 160 and the unintentionally doped semiconductor layer 170 are made of, for example, unintentionally doped GaN.

Figure 2:
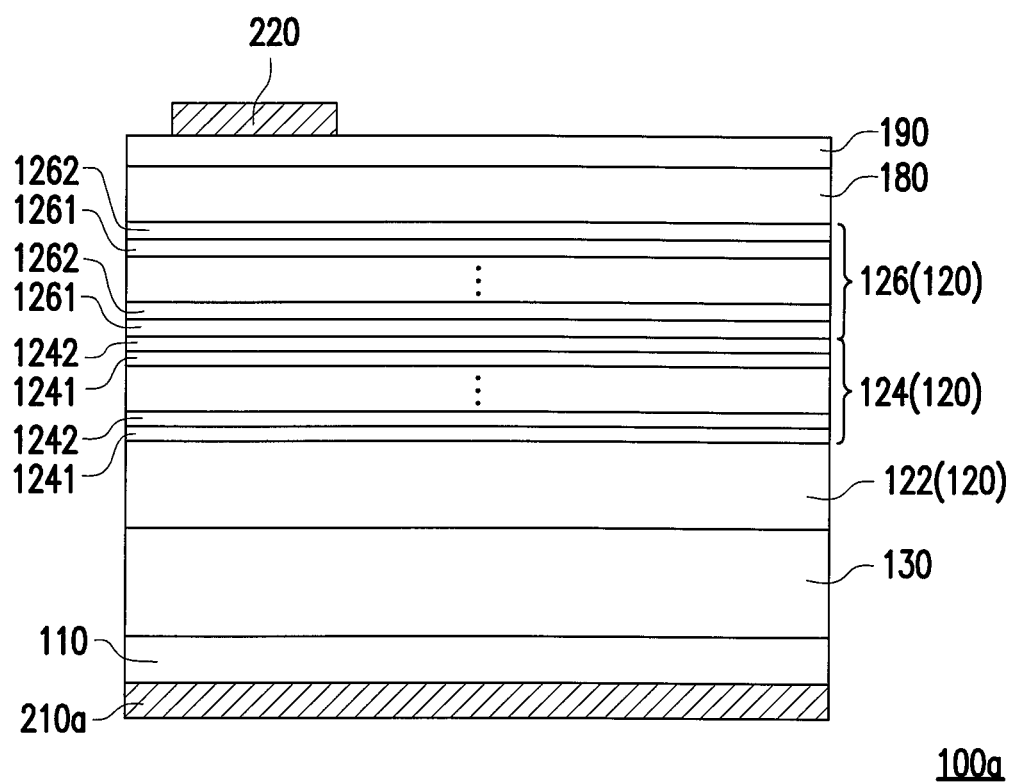
FIG. 2 is a cross-sectional diagram illustrating a semiconductor light-emitting device according to another embodiment of the invention.

FIG. 2 is a cross-sectional diagram illustrating a semiconductor light-emitting device according to another embodiment of the invention. With reference to FIG. 2, a semiconductor light-emitting device 100a of the present embodiment is similar to the semiconductor light-emitting device 100 of the embodiment illustrated in FIG. 1, but different therefrom in below. The semiconductor light-emitting device 100 of FIG. 1 is a horizontal-type light-emitting diode (LED), in which both the first electrode 210 and the second electrode 220 are located at the same side of the semiconductor light-emitting device 100, while the semiconductor light-emitting device 100a of the present embodiment is a vertical-type LED, in which a first electrode 210a and the second electrode 220 are located at opposite sides of the semiconductor light-emitting device 100. In the present embodiment, the first electrode 210a is an electrode layer disposed on a surface of the N-type semiconductor layer 110 which faces away from the light-emitting layer 130. However, in other embodiments, a conductive substrate may be disposed between the first electrode 210a and the N-type semiconductor layer 110. Namely, the first electrode 210a and the N-type semiconductor layer 110 may be respectively disposed on opposite surfaces of the conductive substrate.

To summarize, in the semiconductor light-emitting device provided by the embodiments of the invention, since all the P-type semiconductor layers between the light-emitting layer and the contact layer contain aluminum, the band gap of each of the P-type semiconductor layers can be increased. In this way, the light emitted from the light-emitting layer be less absorbed by the P-type semiconductor layers, such that the luminance efficiency of the semiconductor light-emitting device can be improved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor light-emitting device, comprising:
   an N-type semiconductor layer;
   a plurality of P-type semiconductor layers;
   a light-emitting layer, disposed between the N-type semiconductor layer and the whole of the P-type semiconductor layers; and
   an indium gallium nitride (InGaN) contact layer, wherein the P-type semiconductor layers are disposed between the InGaN contact layer and the light-emitting layer,
   wherein all the P-type semiconductor layers between the light-emitting layer and the InGaN contact layer comprise aluminum, and the P-type semiconductor layers further comprise:
      a first P-type super lattice layer; and
      a P-type indium aluminum gallium nitride (InAlGaN) layer, disposed between the light-emitting layer and the first P-type super lattice layer, wherein the first P-type super lattice layer is disposed between the P-type InAlGaN layer and the InGaN contact layer,
   wherein the first P-type super lattice layer comprises a plurality of first P-type aluminum gallium nitride (AlGaN) layers and a plurality of second P-type AlGaN layers which are alternately stacked, and concentration of a P-type dopant in each of the first P-type AlGaN layers is different from concentration of a P-type dopant in each of the second P-type AlGaN layers,
   wherein the concentration of the P-type dopant in each of the first P-type AlGaN layers falls within a range from $10^{19}$ atoms/cm$^3$ to $10^{20}$ atoms/cm$^3$ and a mole ratio of aluminum therein falls within a range of 10~15%, and the concentration of the P-type dopant in each of the second P-type AlGaN layers falls within a range from $5\times10^{18}$ atoms/cm$^3$ to $5\times10^{19}$ atoms/cm$^3$ and a mole ratio of aluminum therein falls within a range of 1~5%,
   wherein the P-type semiconductor layers further comprise a second P-type super lattice layer disposed between the first P-type super lattice layer and the InGaN contact layer, and concentration of aluminum in the second P-type super lattice layer is lower than concentration of aluminum in the first P-type super lattice layer,
   wherein the second P-type super lattice layer comprises a plurality of third P-type AlGaN layers and a plurality of fourth P-type AlGaN layers which are alternately stacked, and concentration of a P-type dopant in each of the third P-type AlGaN layers is different from concentration of a P-type dopant in each of the fourth P-type AlGaN layers,
   wherein the concentration of the P-type dopant in each of the third P-type AlGaN layers falls within a range from $10^{19}$ atoms/cm$^3$ to $5\times10^{19}$ atoms/cm$^3$ and a mole ratio of aluminum therein falls within a range of 3~8%, and the concentration of the P-type dopant in each of the fourth P-type AlGaN layers falls within a range from $5\times10^{18}$ atoms/cm$^3$ to $10^{19}$ atoms/cm$^3$ and a mole ratio of aluminum therein falls within a range of 1~3%, and
   wherein a doping concentration in the contact layer is greater than a doping concentration in each of the plurality of p-type semiconductors layers.

2. The semiconductor light-emitting device according to claim 1, wherein the P-type dopant of the P-type semiconductor layers is a group IIA element dopant.

3. The semiconductor light-emitting device according to claim 2, wherein the group IIA element dopant is a magnesium (Mg) dopant.

4. The semiconductor light-emitting device according to claim 1, wherein the InGaN contact layer is an ohmic contact layer.

5. The semiconductor light-emitting device according to claim 1, further comprising:
   a first electrode, electrically connected to the N-type semiconductor layer; and
   a second electrode, disposed on the InGaN contact layer.

6. The semiconductor light-emitting device according to claim 1, wherein light emitted from the light-emitting layer comprises blue light, ultraviolet (UV) light or a combination thereof.

* * * * *